United States Patent [19]

Chau et al.

[11] Patent Number: 5,512,496
[45] Date of Patent: Apr. 30, 1996

[54] METHOD OF MAKING COLLECTOR-UP BIPOLAR TRANSISTOR HAVING IMPROVED EMITTER INJECTION EFFICIENCY

[75] Inventors: Hin F. Chau, Plano; Hua Q. Tserng, Dallas, both of Tex.

[73] Assignee: Texas Instruments Incorporated, Dallas, Tex.

[21] Appl. No.: 483,001

[22] Filed: Jun. 7, 1995

Related U.S. Application Data

[62] Division of Ser. No. 349,343, Dec. 2, 1994.

[51] Int. Cl.$^6$ ................................................ H01L 21/265
[52] U.S. Cl. .................... 437/31; 437/126; 437/133; 437/187; 437/228; 148/DIG. 10; 148/DIG. 11; 148/DIG. 72; 257/197; 257/200; 257/593
[58] Field of Search .............................. 437/31, 126, 133, 437/187, 228; 148/DIG. 72, DIG. 10, DIG. 11; 257/197, 200, 593

[56] References Cited

U.S. PATENT DOCUMENTS

| | | | |
|---|---|---|---|
| 5,106,766 | 4/1992 | Lunardi et al. | 437/31 |
| 5,171,697 | 12/1992 | Liu et al. | 437/31 |
| 5,202,752 | 4/1993 | Honjo | 257/478 |
| 5,208,184 | 5/1993 | Bayraktaroglu | 437/126 |
| 5,242,843 | 9/1993 | Aina | 437/133 |
| 5,298,438 | 3/1994 | Hill | 437/31 |
| 5,434,091 | 7/1995 | Hill et al. | 148/DIG. 72 |
| 5,445,976 | 8/1995 | Henderson et al. | 437/31 |

FOREIGN PATENT DOCUMENTS

| | | | |
|---|---|---|---|
| 3108339 | 5/1991 | Japan | 437/133 |
| 5129588 | 5/1993 | Japan | 257/197 |

Primary Examiner—George Fourson
Assistant Examiner—Long Pham
Attorney, Agent, or Firm—Michael K. Skrehot; James C. Kesterson; Richard L. Donaldson

[57] ABSTRACT

A collector-up bipolar transistor having an undercut region (522) beneath extrinsic regions of a base layer (510) and an emitter layer (508). The extrinsic emitter region is depleted of charge carriers and provides passivation for the extrinsic portion of the base layer (508). Contact to the emitter layer may be made by forming contacts on the top surface of the substrate (500) or in a recess in the backside of the substrate.

6 Claims, 8 Drawing Sheets

METHOD OF MAKING COLLECTOR-UP BIPOLAR TRANSISTOR HAVING IMPROVED EMITTER INJECTION EFFICIENCY

This is a divisional of application Ser. No. 08/349,343, filed Dec. 2, 1994.

RELATED APPLICATIONS

This application includes subject matter which is related to U.S. patent application Ser. No. 08/339,043, "Improved Transistor and Circuit Incorporating Same," (Texas Instruments, Inc., Docket No. TI-19824), filed Nov. 14, 1994.

FIELD OF THE INVENTION

This invention generally relates to semiconductor integrated circuits, and more specifically to high-frequency, high-power bipolar transistors.

BACKGROUND OF THE INVENTION

Conventional emitter-up heterojunction bipolar transistors (HBTs) are known to suffer from diminished performance characteristics because of a large base-collector capacitance. It is well known that the power gain of a bipolar transistor is inversely proportional to the square root of its base-collector capacitance. Collector-up HBTs are advantageous in that the collector area of the transistor can be made significantly smaller than the emitter area. Because of their much smaller base-collector capacitance, collector-up HBTs have considerably higher power gain, higher maximum oscillation frequency ($f_{max}$), and faster switching speed than conventional emitter-up HBTs having the same emitter dimensions. These characteristics make collector-up HBTs especially useful for microwave power and digital applications.

Figure 1:
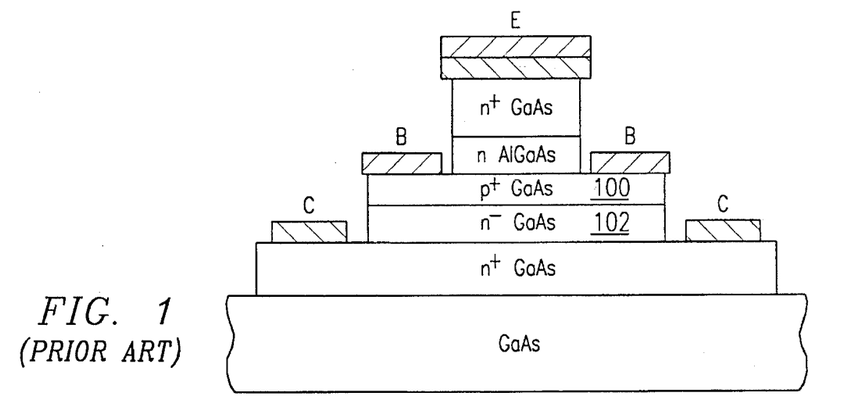
FIG. 1 is a cross-sectional view of a prior art emitter-up HBT.
Figure 2:
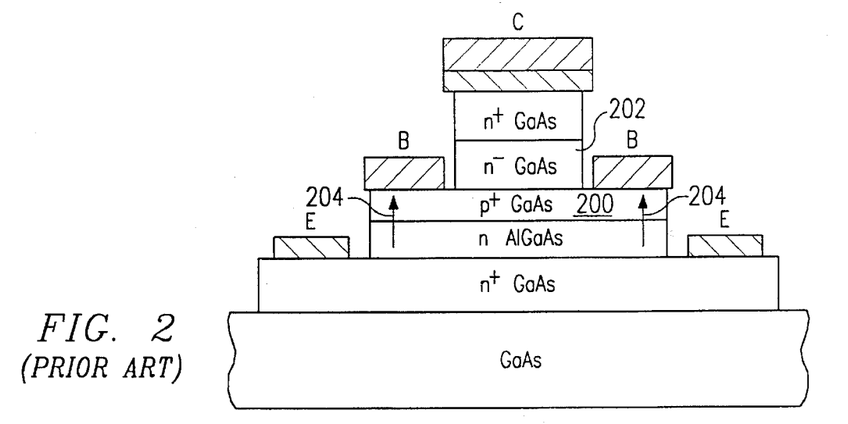
FIG. 2 is a cross-sectional view of a prior art collector-up HBT.

Conventional emitter-up and collector-up HBTs are shown in FIGS. 1 and 2, respectively. Comparison of the interface between the base layer 100 and the collector layer 102 in FIG. 1, and the interface between the base layer 200 and collector layer 202 in FIG. 2, illustrates the advantage in base-collector capacitance of the collector-up configuration. Despite this advantage in base-collector capacitance, collector-up transistors suffer from at least one disadvantage. Since the emitter area is larger than the collector area in collector-up HBTs, electrons are injected from the emitter not only into the base region that lies beneath the collector mesa, but also into the so-called extrinsic base region that lies outside the collector mesa, as represented by arrows 204 in FIG. 2. This electron injection into the extrinsic base region results in excess base leakage current and poor emitter injection efficiency.

Figure 3:
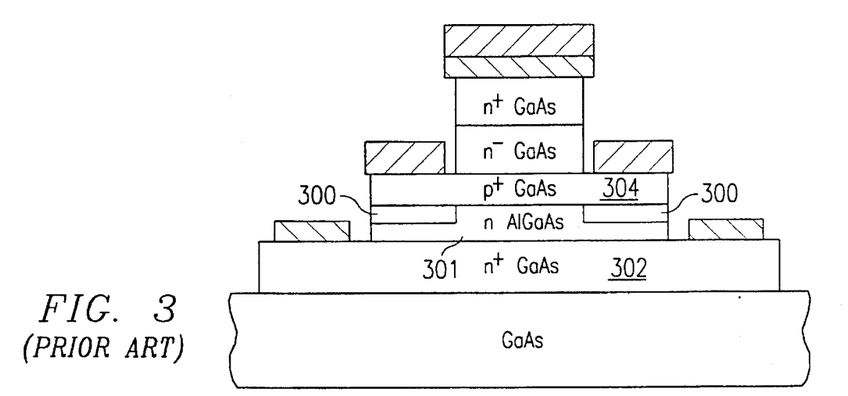
FIG. 3 is a cross-sectional view of a prior art collector-up HBT with a p-n junction in the extrinsic emitter region beneath the extrinsic base region.

Two approaches have been taken in the past to overcome the extrinsic base electron injection problem. The first shown in FIG. 3, forms p-doped regions 300 in the extrinsic regions of the wide bandgap (n-AlGaAs) emitter layer 301. The extrinsic emitter regions lie directly beneath the extrinsic base regions. Since the extrinsic p-AlGaAs/n-AlGaAs junction has a higher turn-on voltage than the intrinsic p+-GaAs/n-AlGaAs junction, the p-n junction formed in the wide bandgap emitter material serves to block electron injection from the n-AlGaAs emitter layer 301 into the extrinsic regions of the base layer 304. The p-doped region 300 can be formed by dopant diffusion, ion implantation, or regrowth. Dopants with fast diffusivities, such as zinc or beryllium, are required in order for the dopants to diffuse through the base 304 to reach the emitter layer 301 underneath. However, the high-diffusivity of these dopants also result in reliability problems. P-type dopant implantation damages both the extrinsic base and emitter layers, resulting in higher base resistance, traps, and non-zero base-emitter leakage current in the implanted regions 300 and the extrinsic portions of the base layer 304 that lie above the regions 300. Extrinsic base and emitter region regrowth requires complicated additional processing steps, and the effects of traps and leakage current along the regrowth boundaries pose reliability problems.

Figure 4:
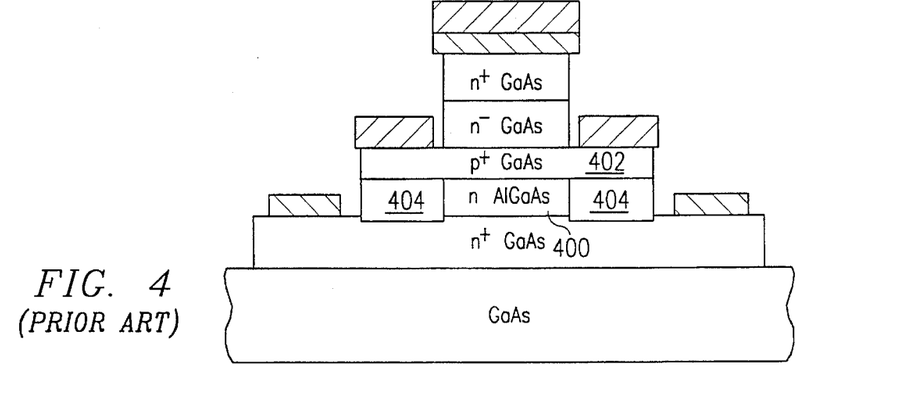
FIG. 4 is a cross-sectional view of a prior art collector-up HBT with a resistive implanted region beneath the extrinsic base region.

FIG. 4 shows the second and more popular approach to the electron injection problem. Ion implantation is used to convert the wide bandgap emitter layer 400 that lies directly beneath the extrinsic base regions 402 into a highly resistive region 404. Similar to the p-type dopant implantation approach discussed above, this technique results in high base resistance, traps, and non-zero base-emitter leakage current in the implanted regions 404, and the extrinsic portions of the base layer 402 that lie above the regions 404, because of the damage caused by the implantation. The present invention intends to address this and other shortcomings of the prior art approaches.

SUMMARY OF THE INVENTION

The present invention provides a collector-up bipolar transistor structure having portions of its emitter cap layer removed from beneath extrinsic emitter regions. The exposed extrinsic emitter regions are depleted by the surface potential of the emitter layer and the built-in potential of the base-emitter junction, and thereby provide surface passivation for the transistor's extrinsic base regions. Such a structure eliminates electron injection from the emitter into the extrinsic base region, improving emitter injection efficiency. The passivation of the extrinsic base regions enhances transistor reliability. The invention also provides for contacting the emitter of the transistor from a backside surface of the substrate on which the transistor is fabricated. This technique offers the advantage of eliminating the frontside emitter contact areas and airbridges to make the structure more compact lower cost, and capable of higher performance than is possible with conventional transistor structures.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Low-capacitance Transistor

Figure 5:
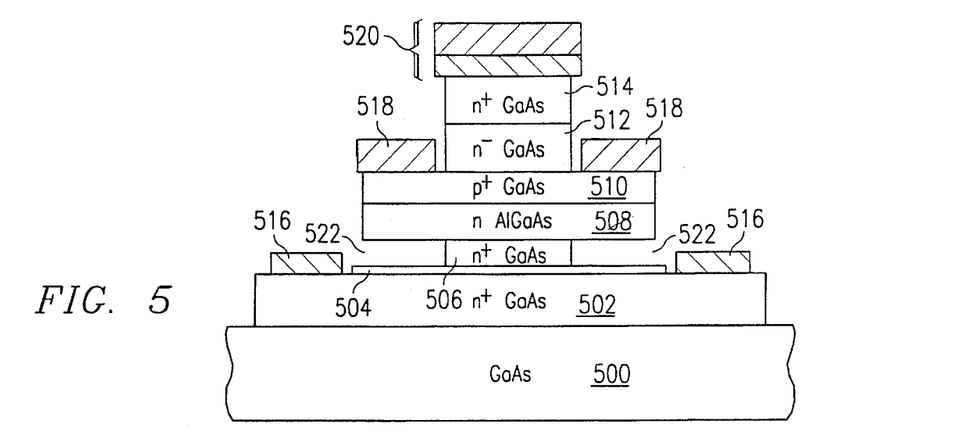
FIG. 5 is a cross-sectional view of a collector-up HBT in accordance with a first preferred embodiment of the invention.

A first preferred embodiment structure is shown in FIG. 5. It should be noted that, though the structure shown in FIG. 5 is fabricated of GaAs and AlGaAs layers, other material systems such as the GaInP/GaAs, AlInP/GaAs, InP/InGaAs, InAlAs/InGaAs and InAlGaAs/InGaAs systems may be used with similar effect. The structure of FIG. 5 comprises a semi-insulating GaAs substrate 500, a heavily doped GaAs emitter contact layer 502, a heavily doped AlGaAs or InGaAs etch stop layer 504, a heavily doped GaAs emitter cap layer 506, a moderately doped AlGaAs emitter layer 508, a heavily doped GaAs base layer 510, a lightly doped GaAs collector layer 512, and a heavily doped GaAs collector contact layer 514. Contact is established to the emitter contact layer 502 by emitter contacts 516. Similarly, base contacts 518 and collector contact 520 provide contact to the base layer 510 and collector contact layer 514, respectively.

The portion of the emitter cap layer 506 lying beneath the extrinsic regions of the emitter layer 508 and base layer 510 is removed to form an undercut region 522. Removal of this portion of the emitter cap layer 506 eliminates the direct injection of electrons from the emitter layer 508 into the extrinsic portion of base layer 510. The emitter injection efficiency and base-emitter capacitance are therefore similar to that of an emitter-up HBT. Additionally, since the extrinsic base regions in a collector-up HBT do not contribute to either the base-emitter or base-collector capacitance, the base contacts 518 can be made wide. It has been shown experimentally that a large base contact width increases the $f_{max}$ of an HBT. Moreover, wide base contacts can be formed with relaxed tolerance lithography because the width of the base contacts is relatively non-critical. The primary limit on base contact width is the aspect ratio of the undercut region 522. For a 0.15 μm emitter cap layer 506, a 1.1 μm undercut can easily be obtained by selective dry etching using, for example, $BCl_3/SF_6$ plasma chemistry. A thicker emitter cap layer 506 allows a deeper undercut to be achieved because it is easier for the etching species to reach its sidewall when the opening is larger. An additional aspect of the structure of FIG. 5 is that the collector layer 512 is thick compared to the emitter layer of an emitter-up HBT. This allows the base contact 518 to be formed in a self-aligned manner and be made much thicker without risk of the base contact 518 shorting to the collector contact 520. The thicker base metal provides lower base resistance and an associated increase in power gain for the transistor.

In the normal operation of the transistor, a flow of electrons is established from the emitter, through the base, and into the collector. This electron current is modulated by holes injected into the base from the base contacts. The holes recombine with some of the electrons from the emitter and therefore result in finite current gain for the transistor. One limitation on current gain is the high density of carrier traps which exists at an exposed semiconductor surface (such as the base layer in a conventional emitter-up HBT). The trap density is typically large enough to create an electric field near the surface that extends some distance into the base layer. Electrons injected near the edge of the emitter mesa in a conventional emitter-up transistor are drawn to the surface of the base layer by this electric field where they recombine in the abundance of traps present at the surface. This undesirable recombination current results in diminished current gain for the transistor. However, in the transistor shown in FIG. 5, the removal of the emitter cap layer 506 exposes the extrinsic region of the emitter layer 508, which is thin enough to be completely depleted of charge carriers by the surface potential and the built-in potential of the base-emitter junction. Surface depletion of the extrinsic emitter layer 508 passivates the extrinsic portions of the base layer 510 and eliminates the direct injection of electrons from the emitter layer 508 into the extrinsic base portions. A thickness of approximately 0.1 μm and a doping concentration of approximately $2 \times 10^{17}$ cm$^{-3}$ can produce an AlGaAs emitter layer 508 with fully depleted extrinsic emitter regions. Passivating the base layer surface in this manner increases both the current gain and reliability of the transistor.

Figure 6A:
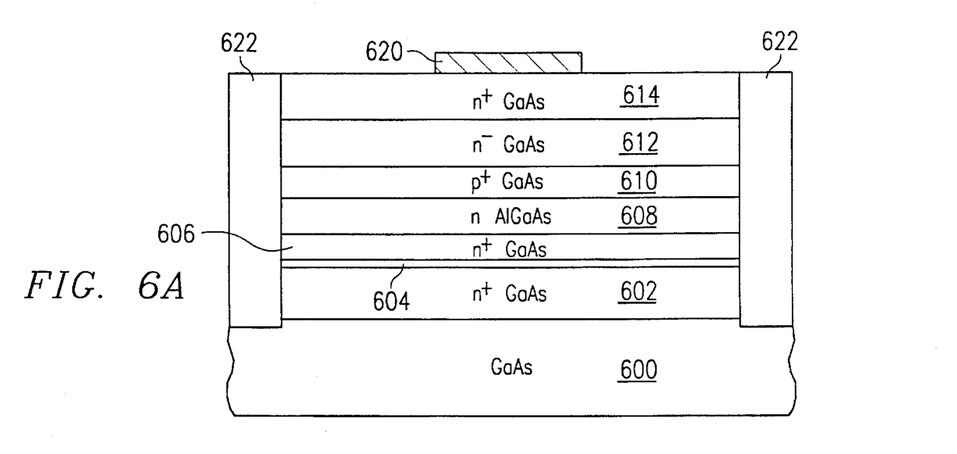
FIGS. 6a–6d are views of a first preferred embodiment transistor structure at various stages of fabrication.

A method of fabricating the first preferred embodiment transistor is shown in FIGS. 6a to 6d. In FIG. 6a a collector contact 620 is formed over a material structure comprising: a semi-insulating GaAs substrate 600 having a thickness of approximately 625 μm; a GaAs emitter contact layer 602 having a thickness of approximately 0.5 μm, and doped with silicon for example to a concentration of approximately $5 \times 10^{18}$ cm$^{-3}$; an $Al_{0.1}Ga_{0.9}As$ or $In_{0.1}Ga_{0.9}As$ etch stop layer 604 having a thickness of approximately 0.02 μm, and doped with silicon for example to a concentration of approximately $5 \times 10^{18}$ cm$^{-3}$; a GaAs emitter cap layer 606 having a thickness of approximately 0.15 μm, and doped with silicon for example to a concentration of approximately $5 \times 10^{18}$ cm$^{-3}$; an $Al_{0.3}Ga_{0.7}As$ emitter layer 608 having a thickness of approximately 0.1 μm, and doped with silicon for example to a concentration of approximately $2 \times 10^{17}$ cm$^{-3}$; a GaAs base layer 610 having a thickness of approximately 0.08 μm, and doped with carbon for example to a concentration of approximately $3 \times 10^{19}$ cm$^{-3}$; a GaAs collector layer 612 having a thickness of approximately 1.0 μm, and doped with silicon for example to a concentration of approximately $2 \times 10^{16}$ cm$^{-3}$; and a GaAs collector contact layer 614 having a thickness of approximately 0.1 μm, and doped with silicon for example to a concentration of approximately $5 \times 10^{18}$ cm$^{-3}$. A heavily n-doped InGaAs layer (not shown) can be grown on the collector contact layer 614 to further improve ohmic contact to that layer. The collector contact 620 comprises a composition such as TiW/Ti/Pt/Au and is formed by a standard technique such as sputtering or evaporation. The transistor may be isolated from other portions of the material structure by ion implantation of protons or oxygen. The ion implanted region is shown in FIG. 6a at 622.

Figure 6B:
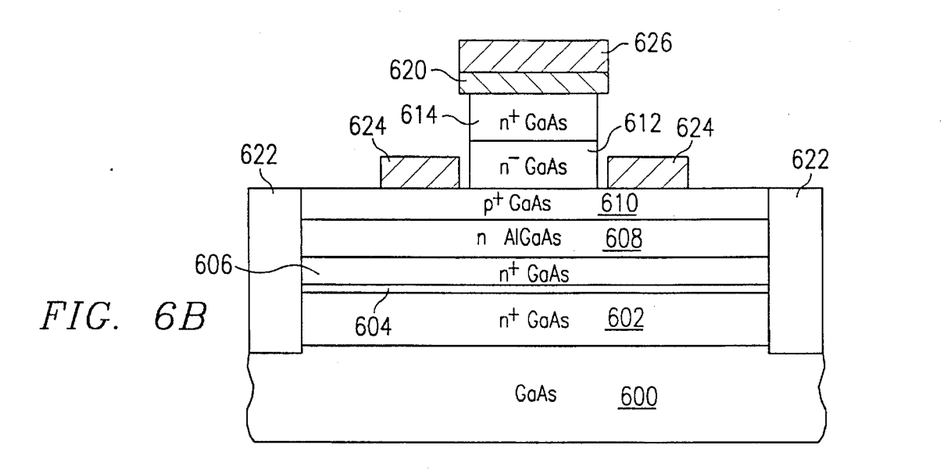

A collector mesa is formed using a standard dry etching technique for the bulk of the material removal, followed by a wet etching technique, in which collector contact 620 is used as an etch mask. Alternatively, photoresist may be used to protect the collector mesa. Portions of the collector contact layer 614 and collector layer 612 are removed, but the etch is stopped on the base layer 610 as shown in FIG. 6b by monitoring the change in surface breakdown voltage. The base contacts 624 can be formed in a self-aligned manner in which the edges of the collector contact 620 define the proximity of the base contacts to the collector mesa. FIG. 6b depicts the results of the self-aligned deposition technique. The base contacts are typically a composition of titanium, platinum and gold. A layer 626 of the base contact metallization is formed tin the collector contact 620 as a result of the self-aligned deposition. In an alternative procedure, photoresist may be used to cover the collector mesa and define the location of the base contacts 624. In this non-self-aligned technique there will be no layer 626 on layer 620.

Figure 6C:
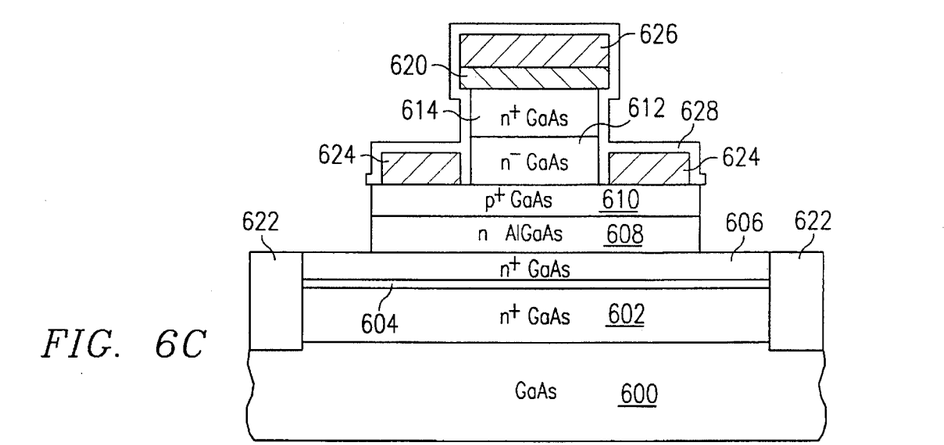

Silicon nitride 628 or a similar dielectric material, such as silicon oxide or oxy-nitride, is uniformly deposited to protect the collector mesa sidewall as shown in FIG. 6c. The base mesa is then formed by first removing the silicon nitride layer 628 from regions to be etched. The silicon nitride is removed in a standard manner using a wet or dry etch technique. Wet chemical etching is then used to remove the base layer 610 and the emitter layer 608 to form the base mesa as shown in FIG. 6c.

Figure 6D:
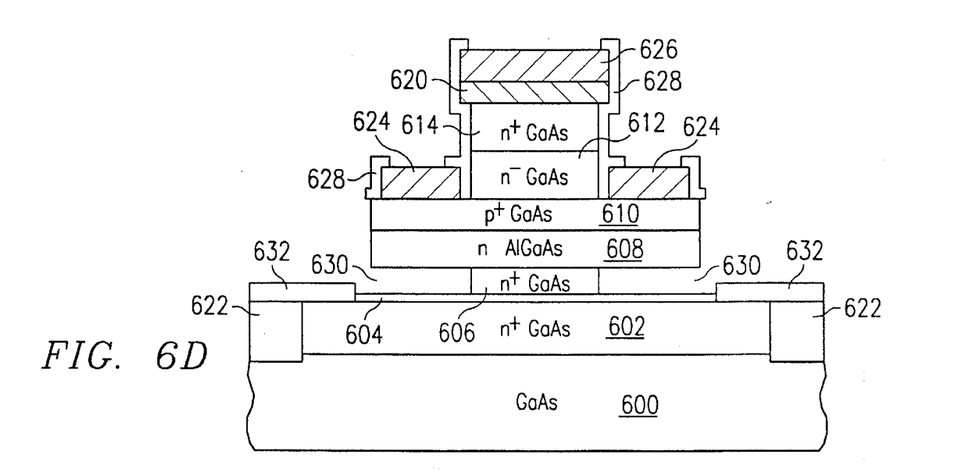

The sub-emitter undercut etching as shown in FIG. 6d is performed by either a dry or wet etch technique. In the dry etch approach reactive ion etching using $BCl_3+SF_6$ is effective for removing the GaAs emitter cap layer 606. The wet etch uses a chemical such as $NH_4OH:H_2O_2$. In either case the AlGaAs or InGaAs etch stop layer 604 and the AlGaAs emitter layer 608 are not effected by the etch. The amount of undercut achieved by the etch is gauged by monitoring a test matrix of base metal fingers of differing widths deposited on the substrate away from the transistor. Those fingers having widths less than twice the amount of undercut are lifted off during the etching. Etching is continued until the finger width just smaller than that matching the desired width of the sub-emitter mesa is lifted off. Following formation of the undercut region 630, photoresist is deposited and patterned for the formation of emitter contacts 632. The emitter contacts typically consist of a metal composite which includes germanium, nickel, and gold. Portions of the silicon nitride 628 covering the base contacts 624 and collector contact 626 are then removed to provide access to the base and collector contacts. The stress inherent in the silicon nitride layer 628 also enhances the mechanical support of the ledge formed by the base layer 610 and the emitter layer 608 after the formation of the undercut region 630. The resulting structure is shown in FIG. 6d.

Figure 7:
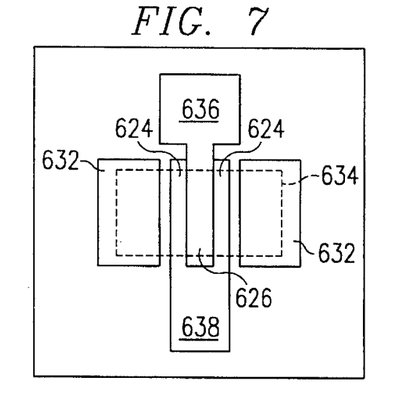
FIG. 7 is a plan view of a transistor in accordance with a first preferred embodiment of the invention.

FIG. 7 is a plan view of the transistor shown in FIG. 6d. The collector contact "finger" formed by collector contact 626 is connected to a collector contact pad 636. The collector contact finger is straddled by the base contact fingers 624, which are connected to base contact pad 638. The emitter contact pads 632 extend outside the active region 634 defined by the ion implantation area shown in FIG. 6d by regions 622.

Compact Transistor

Figure 8:
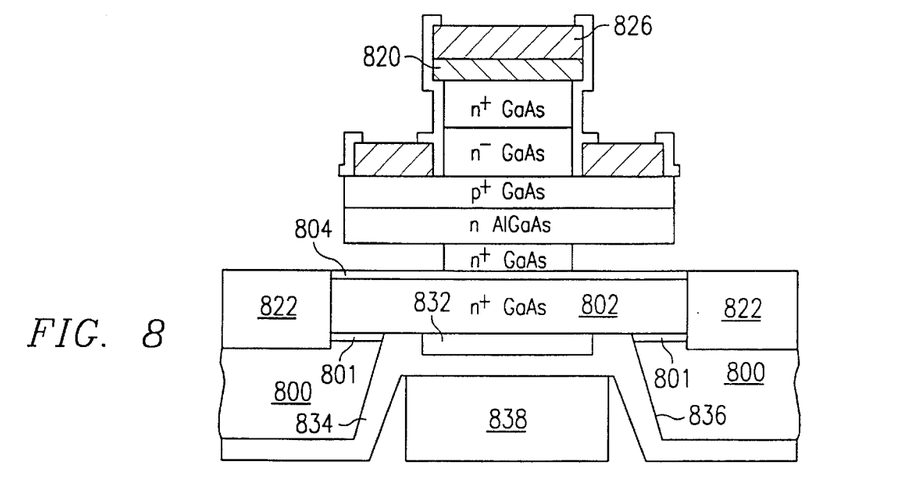
FIG. 8 is a cross-sectional view of a collector-up HBT have an emitter contact on a backside of the substrate in accordance with a second preferred embodiment of the invention.

The cost of integrated circuits is directly proportional to the amount of the surface area of a semiconductor wafer that transistors and circuits occupy. Hence, improvements that allow a transistor to be more compact are important. FIG. 8 shows a second preferred embodiment structure designed to be a compact version of the transistor shown in FIGS. 5 and 6d. The structure of FIG. 8 is similar to the first preferred embodiment structure except that the material structure has an additional heavily doped etch stop layer 801, and the emitter contact 832 is formed in a "bathtub" recess 836 in the backside of the substrate 800. The second preferred embodiment structure is fabricated in a manner similar to that of the first preferred embodiment structure. However, instead of depositing emitter contacts on the front or top side of the substrate, the structure is flipped and mounted with the topside down on a quartz or sapphire carrier using a layer of wax or optical adhesive. The wafer is thinned to a thickness in the range of approximately 50 to 150 μm, and the bathtub recess 836 is etched. The bathtub recess 836 may be formed using a reactive ion etching process similar to that used for forming conventional via holes. The etch depth can be controlled through the use of thin layers of an etch stop material such as AlGaAs or InGaAs 801 in the material structure to facilitate stopping the etch. In lieu of an etch stop layer, a simple timing technique may be used to control the recess etch. Another technique is to etch in timed intervals between which a physical measurement of the etch depth is made. Yet another technique is to etch in timed intervals and monitor the current between probes placed on the etched surface. The difference between a heavily doped layer such as the etch stop layer 801 and the semi-insulating substrate 800 is readily discernible using this technique. The etch stop layer 801 may be removed by a separate etch to expose the emitter contact layer 802.

Emitter contact 832 is then formed of a composition such as Ge/Ni/Au or Ti/Pt/Au, for example, by patterning photoresist to expose the desired contact region and then lifting off the excess metal after evaporation. The emitter contact 832 can be made much larger than the collector contact (represented by the layer 820 and 826), and can even extend to the edge of the ion implanted regions 822. The emitter contact lithography and alignment with the transistor structure on the opposite surface of the substrate is therefore not critical. Gold 834 is electroplated to a thickness of approximately 25 μm for the purpose of coupling the emitter contact 832 to the bottom surface of substrate 800. FIG. 8 is not drawn to scale. The gold layer 834 is thicker than shown in FIG. 8. The size of the emitter contact 832 may be limited by the thickness and rigidity of the emitter contact layer 802, but the thick electroplated gold also serves to enhance the mechanical rigidity of the structure. As the substrate 800 is removed, the thick electroplated gold 834 and the emitter contact layer 802 (in addition to the thin etch stop layers 801 and 804) become the only support for the transistor structure.

Figure 9:
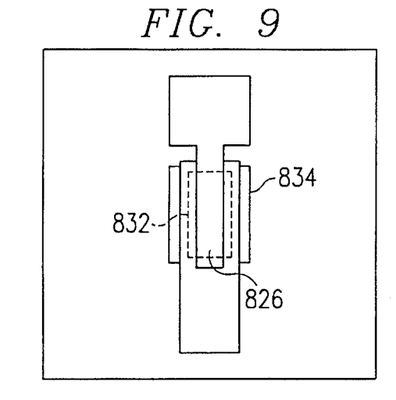
FIG. 9 is a plan view of a transistor in accordance with a second preferred embodiment of the invention.

An advantage of the second preferred embodiment structure is made apparent by a comparison of the plan view of the second preferred embodiment shown in FIG. 9, and the plan view of the first preferred embodiment shown in FIG. 7. The elimination of the topside emitter contacts 632 shown in FIG. 7 results in a much more compact transistor layout. The emitter contact 832 is wider than the collector finger 826 in FIG. 9, and its size is not critical because it is on the backside of the structure. In addition, the active region 834 defined by ion implantation can be made much smaller than that of the structure shown in FIG. 7. A thick gold heatsink 838 can be selectively plated in the bathtub recess 836. Since the emitter contact 832 is in direct with the heatsink 838, this structure has much lower thermal impedance than does an emitter-up HBT. A lower thermal resistance provides improved transistor performance and is important for power applications. Also, in emitter-up HBT monolithic microwave integrated circuits (MMICs), the use of long interconnecting emitter transmission lines results in large emitter inductance, which limits the gain of such circuits. The use of a backside emitter contact significantly reduces emitter inductance by eliminating interconnecting emitter lines on the top surface of the circuit. Lower emitter inductance can provide higher transistor and circuit gain. In addition, eliminating front-side emitter grounding pads in collector-up HBT MMICs not only saves substantial area, but also provides better flexibility in circuit topology and layout, which is important to the circuit designer.

Figure 10:
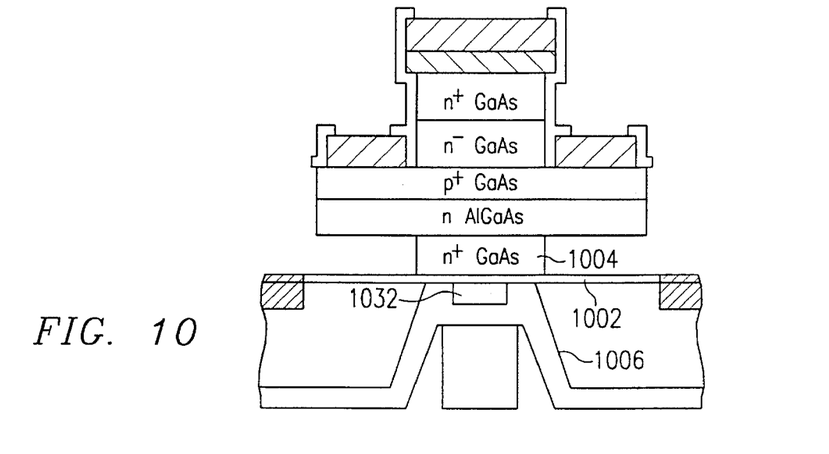
FIG. 10 is a cross-sectional view of a collector-up HBT in accordance with a third preferred embodiment of the invention.

A third preferred embodiment transistor is shown in FIG. 10. This structure includes only a single etch stop layer 1002, and a single emitter cap layer 1004. The etch stop layer 1002 is used for both the emitter cap layer 1004 undercut etching and the backside recess 1006 formation. An optional heatsink 1034, similar to that in the structure of FIG. 8, may be formed in the recess 1006. In order to ensure structural continuity, the backside recess 1006 is smaller than the emitter cap layer 1004 that is left following the undercut etch. Consequently, the emitter contact 1032 is smaller than the collector contact (represented by metal layers 1020 and 1026). So, while the structure of the third preferred embodiment is simpler than that of the first or second preferred embodiments, the emitter alignment is more critical.

Multiple Finger Transistors

Figure 11:
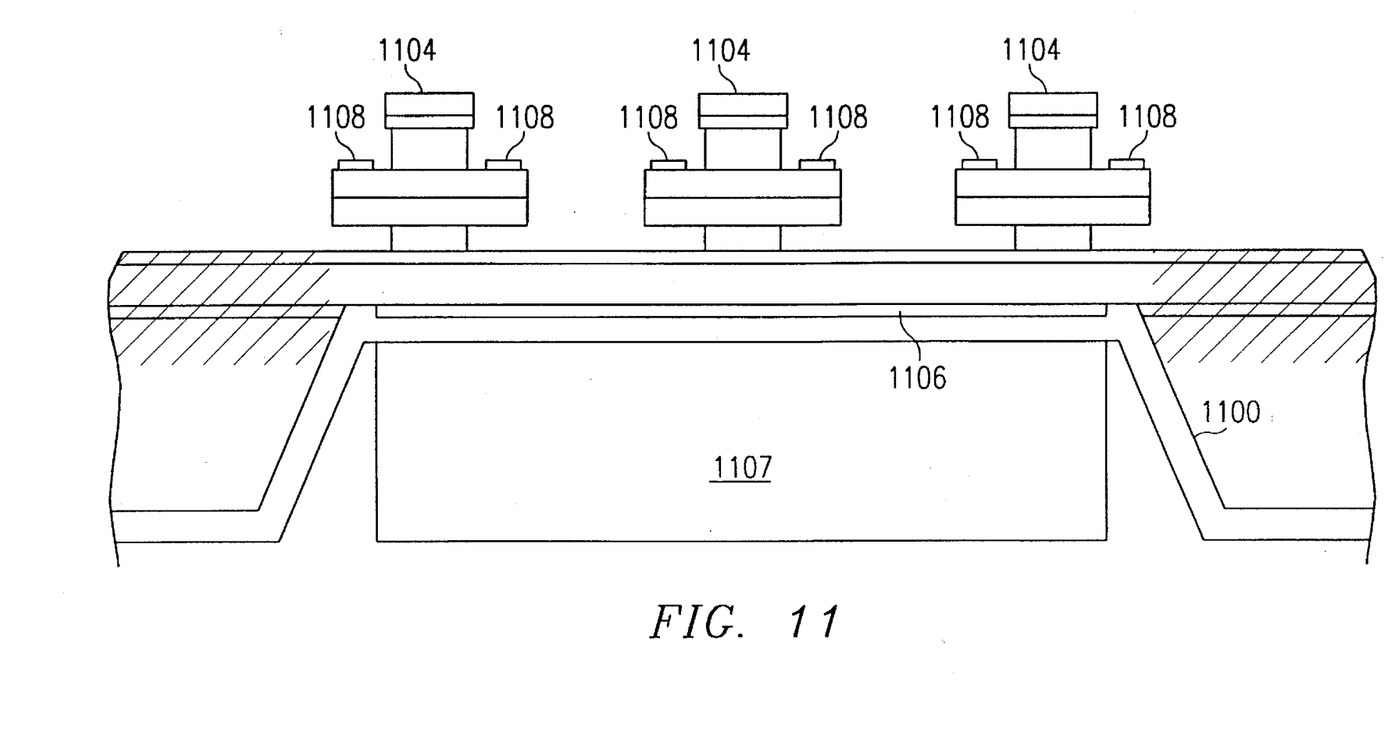
FIG. 11 is a cross-sectional diagram of a multiple finger transistor in accordance with a fourth preferred embodiment of the invention.

The transistor structures shown in the preceding figures are unit transistors, and hence are shown to possess a single emitter, base, and collector. High-power transistors are typically fabricated to have a plurality of unit transistors connected in parallel. A fourth preferred embodiment multiple finger transistor is shown in FIG. 11. The unit transistors are formed in the manner described hereinabove. The recess etch 1100, emitter contact 1106, and optional heatsink 1107 are shown in FIG. 11 as extending the entire length of the series of transistors. An alternative approach is to form a recess and deposit an emitter contact and heatsink for each unit transistor. Electroplated gold couples the emitter contact 1106 to the backside of the substrate. The ready access to the backside of the substrate and to ground is advantageous for common emitter transistor configurations.

Figure 12A:
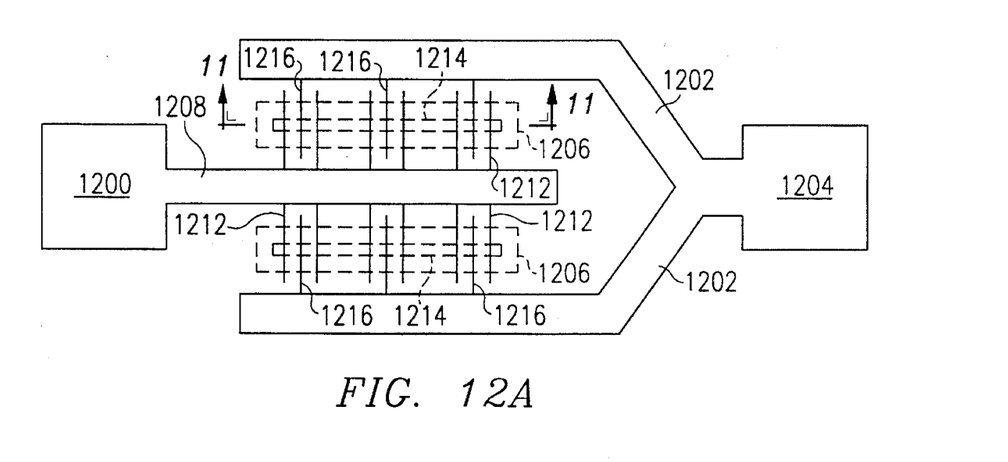
FIGS. 12a and 12b are plan views of transistor layouts incorporating the structure configured in accordance with the fourth preferred embodiment of the invention shown in FIG. 11.

FIG. 12a is a plan view of a transistor layout incorporating the fourth preferred embodiment structure. The input terminal of the transistor is bondpad 1200. The output terminal is bondpad 1204. The backside recess 1206 and emitter contact 1214 are shown dashed as they are formed on the backside of the substrate. Output transmission line 1202 couples the collector contacts 1216 to the output bondpad 1204. Base contact fingers 1212 extend from input transmission line 1208. Section lines show the relation of the fourth preferred embodiment structure shown in FIG. 11 to that of the layout of FIG. 12a.

Figure 12B:
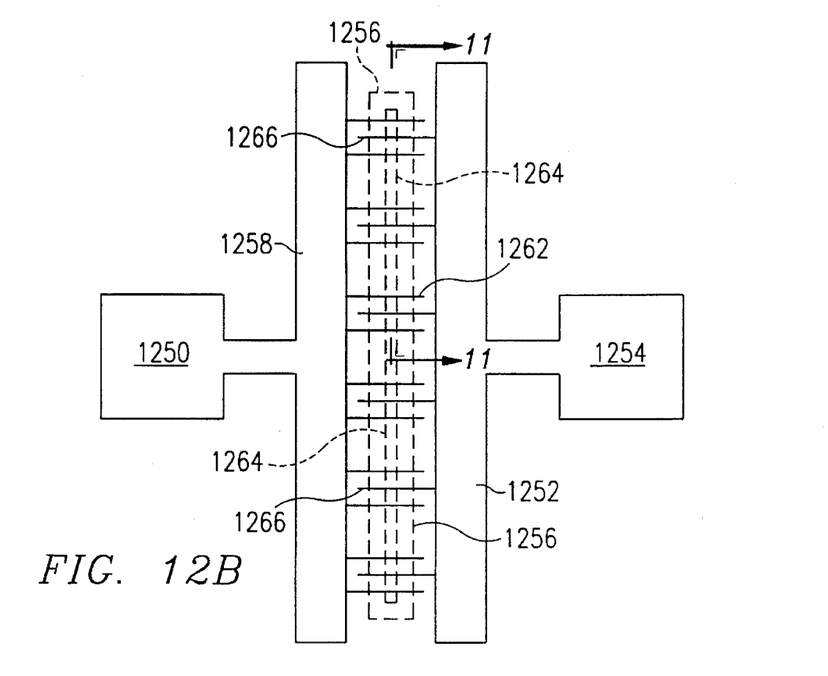

FIG. 12b is another layout incorporating the fourth preferred embodiment structure. The input terminal of the transistor is bondpad 1250, and the output terminal is bondpad 1254. Base contact fingers 1262 extend from input transmission line 1258. The backside recess etch 1256 and the emitter contact 1264 are shown dashed as they are formed on the backside of the substrate. Output transmission line 1252 couples the collector contacts 1266 to the output bondpad 1254. Section lines show the relation of the fourth preferred embodiment structure shown in FIG. 11 to that of the layout of FIG. 12b. It may be appreciated that the layouts shown in FIG. 12a and FIG. 12b eliminate the requirement for the airbridges that add process difficulty and cost to prior monolithic integrated circuits.

Figure 13:
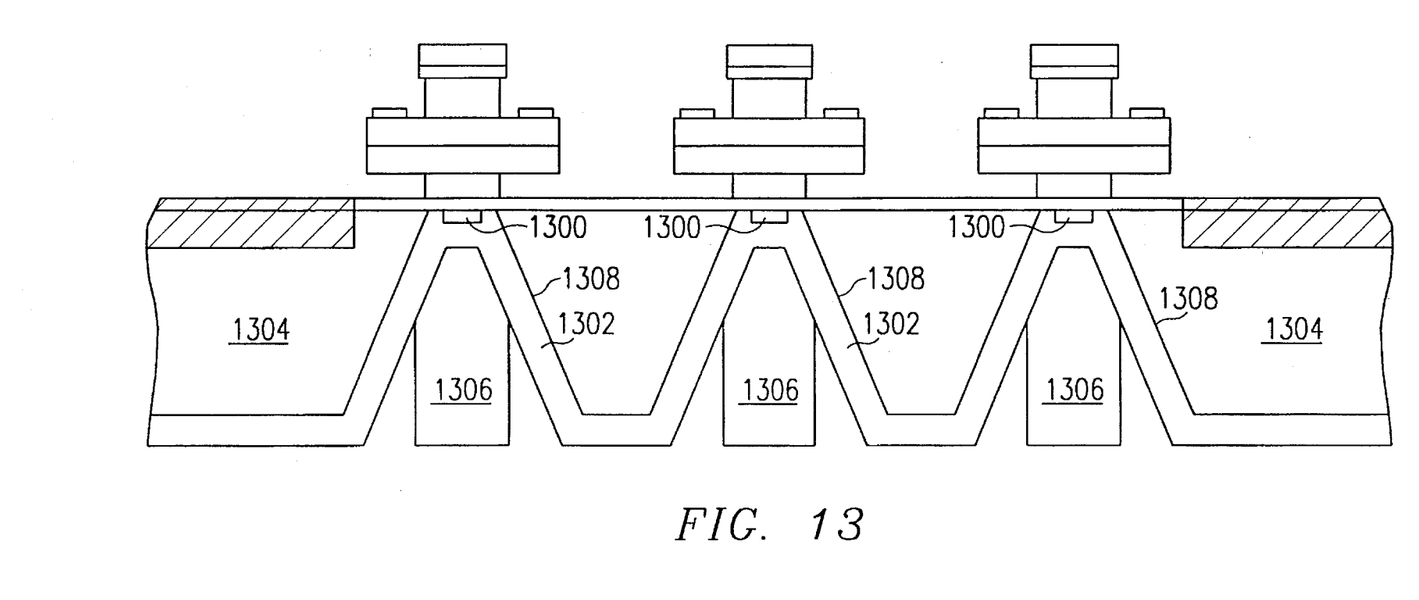
FIG. 13 is a cross-sectional diagram of a multiple finger transistor in accordance with a fifth preferred embodiment of the invention.
Figure 14A:
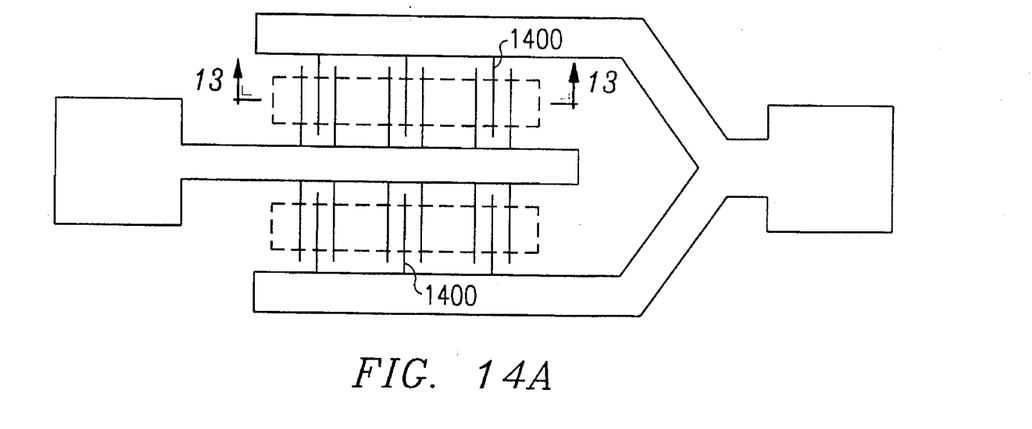
FIGS. 14a and 14b are plan views of transistor layouts incorporating the structure configured in accordance with the fifth preferred embodiment of the invention shown in FIG. 13.
Figure 14B:
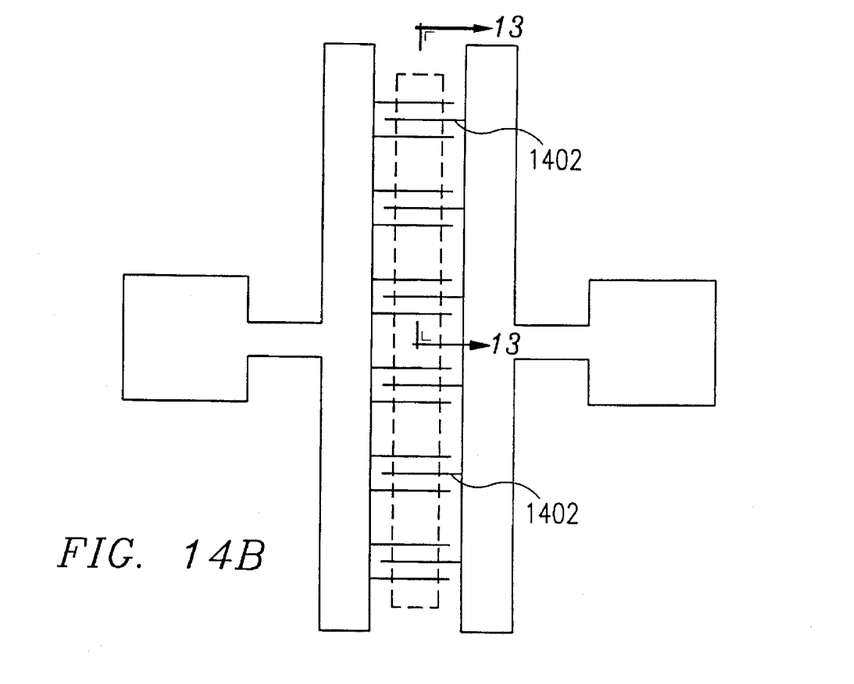

The unit transistor shown in FIG. 10 can also be connected in parallel to form a fifth preferred embodiment multiple finger transistor, shown in FIG. 13. In the structure of FIG. 13, each unit transistor has its own emitter contact 1300. Electroplated gold 1302 can be applied to couple the emitter contacts 1300 to one another and to the backside of the substrate 1304. A gold heatsink 1306 can be formed by a plating process in each recess 1308. FIGS. 14a and 14b are plan views of transistor layouts incorporating the fifth preferred embodiment structure. The structures of FIGS. 14a and 14b are similar to those of FIGS. 12a and 12b, except that the individual emitter contacts (1300 in FIG. 13) lie directly beneath the collector contacts (1400 in FIG. 14a and 1402 in FIG. 14b), and are therefore not shown in FIGS. 14a and 14b.

A few preferred embodiments have been described in detail hereinabove. It is to be understood that the scope of the invention also comprehends embodiments different from those described, yet within the scope of the claims.

Internal and external connections can be ohmic, capacitive, inductive, direct or indirect, via intervening circuits or otherwise. Implementation is contemplated in discrete components or fully integrated circuits in silicon, gallium arsenide, indium phosphide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, it is contemplated that the transistor structures described herein may be integrated on a substrate with other components such as resistors, capacitors, inductors, and so forth to form monolithic integrated circuits. It is therefore intended that the appended claims encompass any such modifications or embodiments.

What is claimed is:

1. A method of forming a bipolar transistor, comprising the steps of:

forming a collector layer over a base layer;

forming said base layer over an emitter layer;

forming said emitter layer over an emitter cap layer;

removing a portion of said emitter cap layer so that said base and emitter layers extend beyond an edge of said emitter cap layer; and forming a base contact on a portion of said base layer extending beyond said edge.

2. The method of claim 1, wherein said step of removing said emitter cap layer exposes a surface of a portion of said emitter layer extending beyond said edge, and wherein said exposed surface creates a surface potential, which together with the built-in potential of a junction between said base and emitter layers depletes of charge carriers said portion of said emitter layer extending beyond said edge.

3. The method of claim 1, further comprising the steps of forming an emitter contact layer beneath said emitter cap layer, and forming an emitter contact on a top surface of said emitter contact layer.

4. The method of claim 1, further comprising the steps of forming a collector contact layer over said collector layer, and forming a collector contact on said collector contact layer.

5. The method of claim 1, further comprising the step of forming an emitter contact beneath said emitter cap layer.

6. The method of claim 5, further comprising forming a layer of metallization to cover said emitter contact.

* * * * *